United States Patent
Yokota

(10) Patent No.: US 7,095,627 B2
(45) Date of Patent: Aug. 22, 2006

(54) FREQUENCY-SELECTIVE SHIELD STRUCTURE AND ELECTRIC DEVICE HAVING THE STRUCTURE

(75) Inventor: Hitoshi Yokota, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 143 days.

(21) Appl. No.: 10/756,457

(22) Filed: Jan. 14, 2004

(65) Prior Publication Data

US 2004/0206527 A1    Oct. 21, 2004

(30) Foreign Application Priority Data

Mar. 7, 2003   (JP) ............... 2003-060785
Nov. 28, 2003  (JP) ............... 2003-398390

(51) Int. Cl.
*H05K 9/00* (2006.01)
*H01Q 5/12* (2006.01)
*H04B 3/21* (2006.01)

(52) U.S. Cl. ............. 361/816; 361/800; 361/818; 174/35 R; 343/909; 333/12

(58) Field of Classification Search ......... 343/909, 343/898, 905; 333/12; 361/800, 816, 818; 174/35 R, 35 GC, 32, 35 MS
See application file for complete search history.

(56) References Cited

U.S. PATENT DOCUMENTS

| | | | | |
|---|---|---|---|---|
| 4,792,810 A | * | 12/1988 | Fukuzawa et al. | 343/778 |
| 5,208,603 A | * | 5/1993 | Yee | 343/909 |
| 5,943,015 A | * | 8/1999 | Webb | 343/700 MS |
| 6,218,978 B1 | * | 4/2001 | Simpkin et al. | 342/5 |
| 6,232,931 B1 | * | 5/2001 | Hart | 343/909 |
| 6,512,487 B1 | * | 1/2003 | Taylor et al. | 343/795 |
| 6,927,745 B1 | * | 8/2005 | Brown et al. | 343/909 |
| 6,943,651 B1 | * | 9/2005 | Mukaiyama et al. | 333/219.1 |

FOREIGN PATENT DOCUMENTS

JP        2002-50893       2/2002

* cited by examiner

*Primary Examiner*—K. Cuneo
*Assistant Examiner*—Dameon E. Levi
(74) *Attorney, Agent, or Firm*—Mattingly, Stanger, Malur & Brundidge, P.C.

(57) ABSTRACT

A shield structure that transmits a radio wave in a specific frequency band and that exhibits a high shield characteristic in other bands. An opening portion having a specific shape and a specific perimeter length is formed on a conductor. A filter having a specific shape and a specific size is connected to the opening portion.

35 Claims, 15 Drawing Sheets

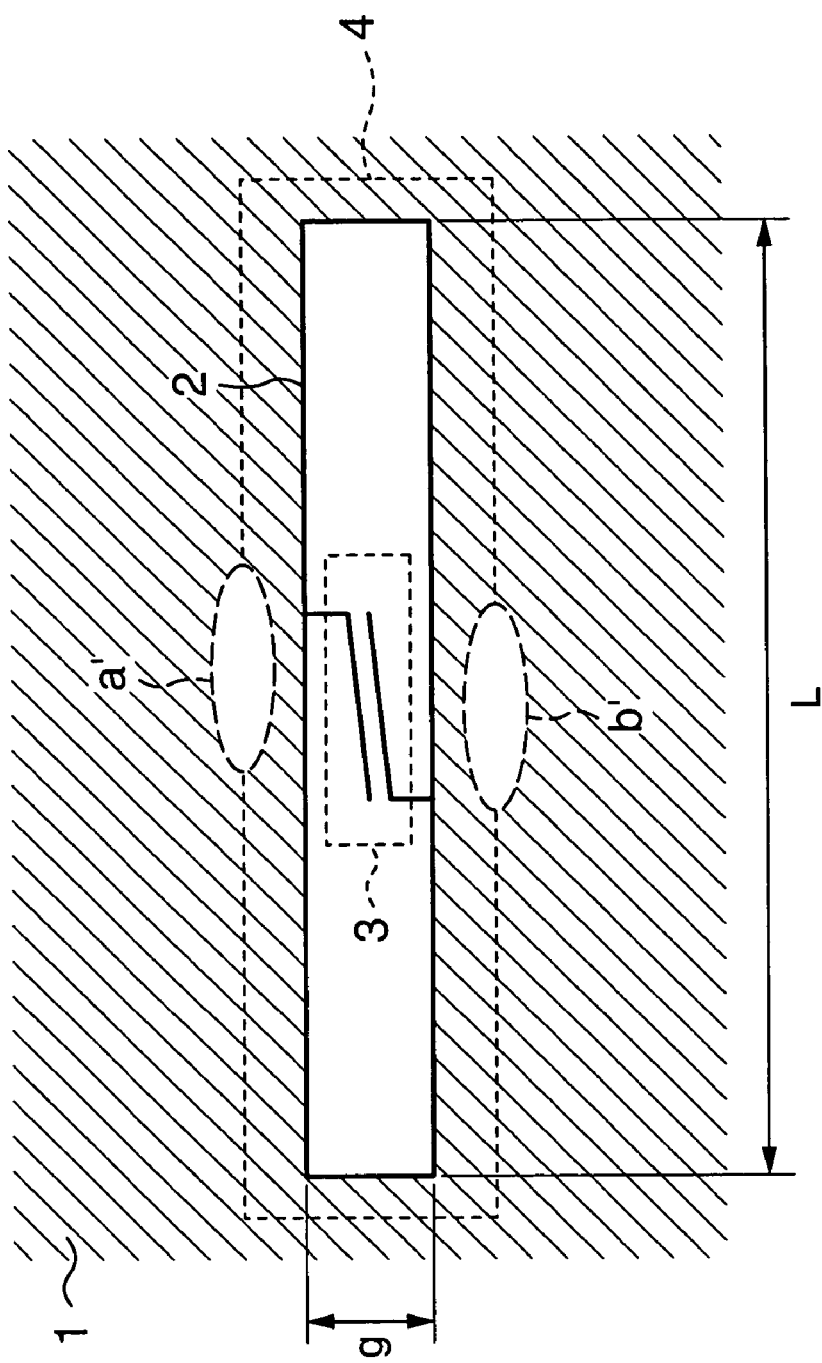
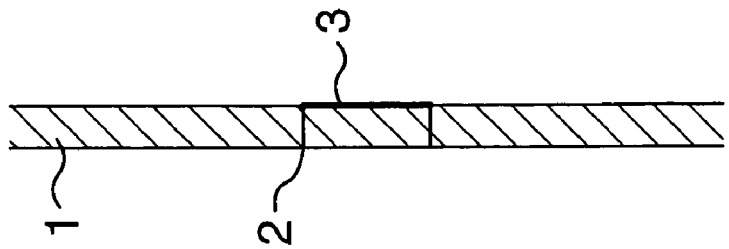

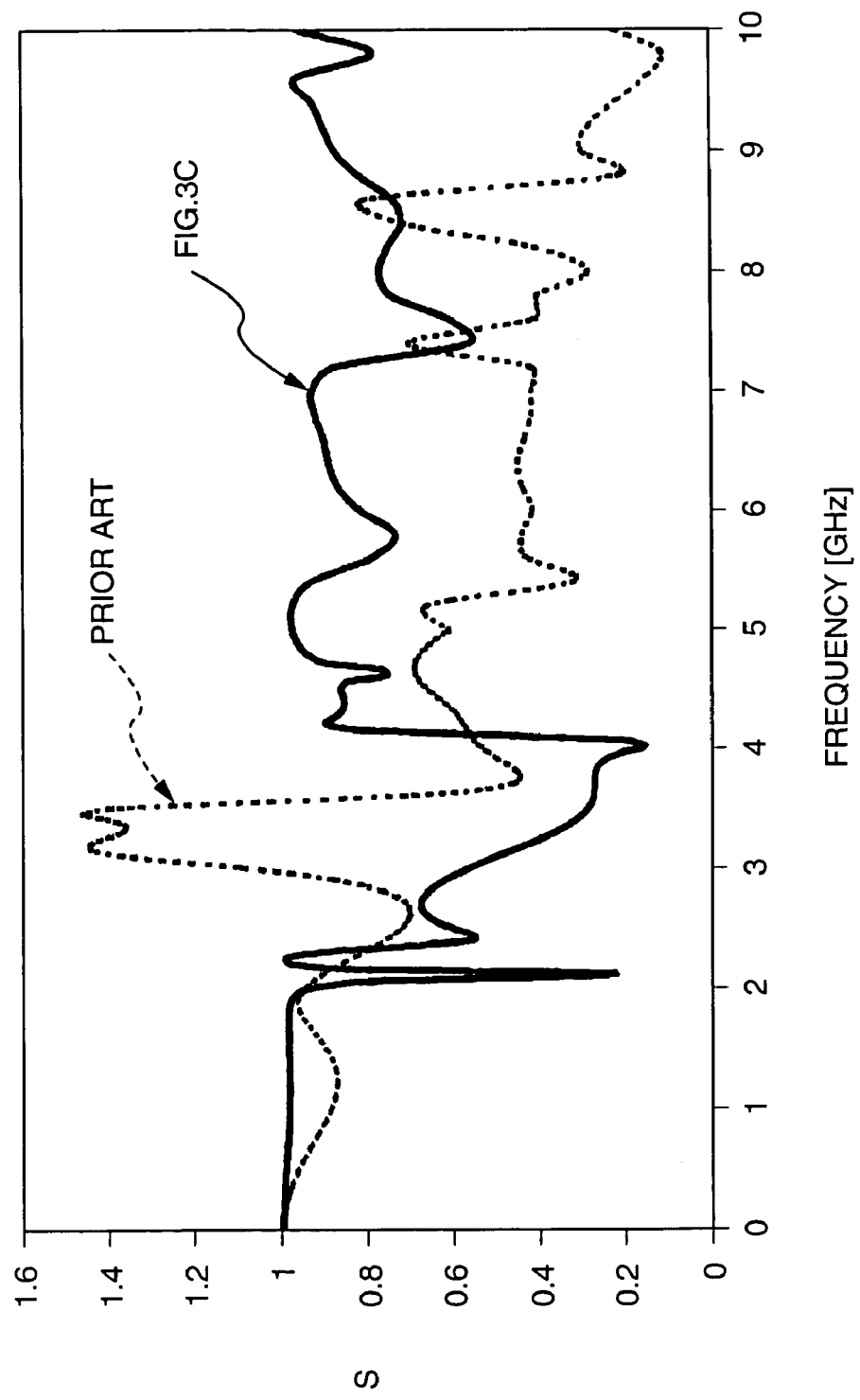

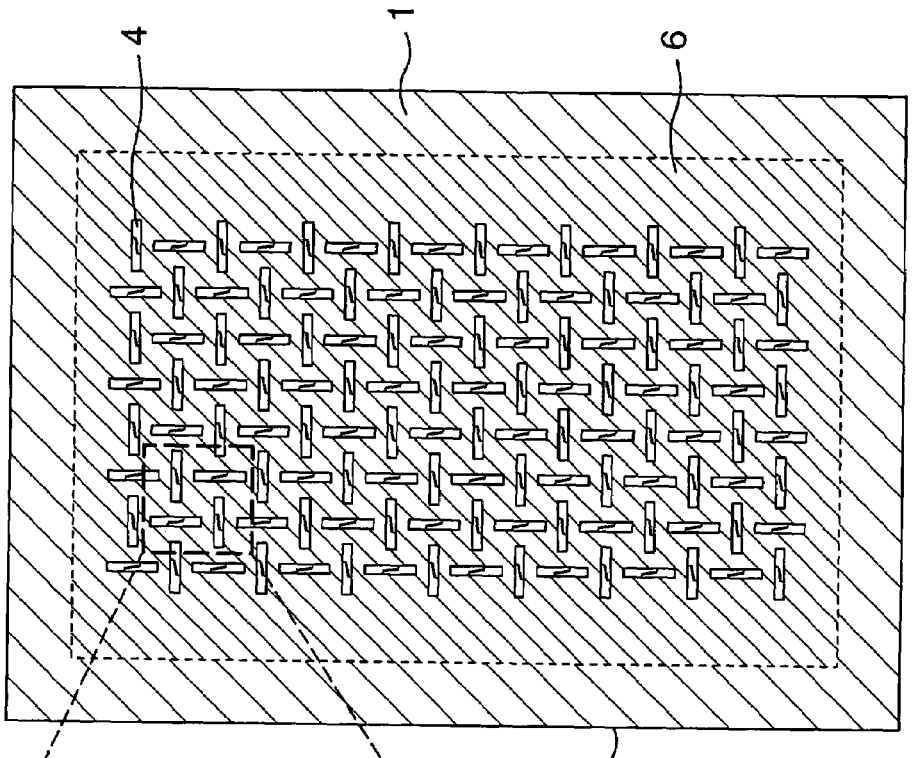
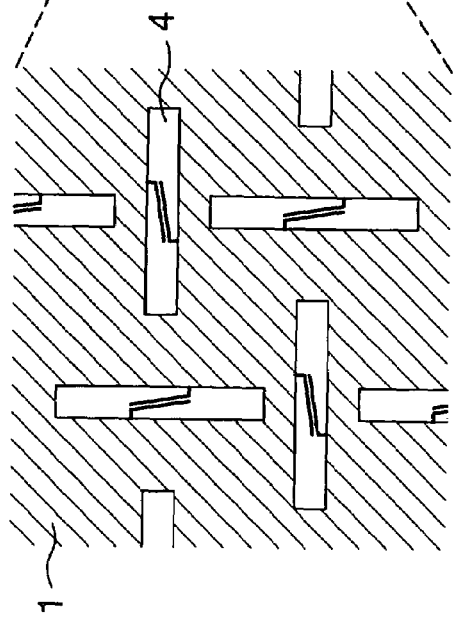
FIG.8A
FIG.8B

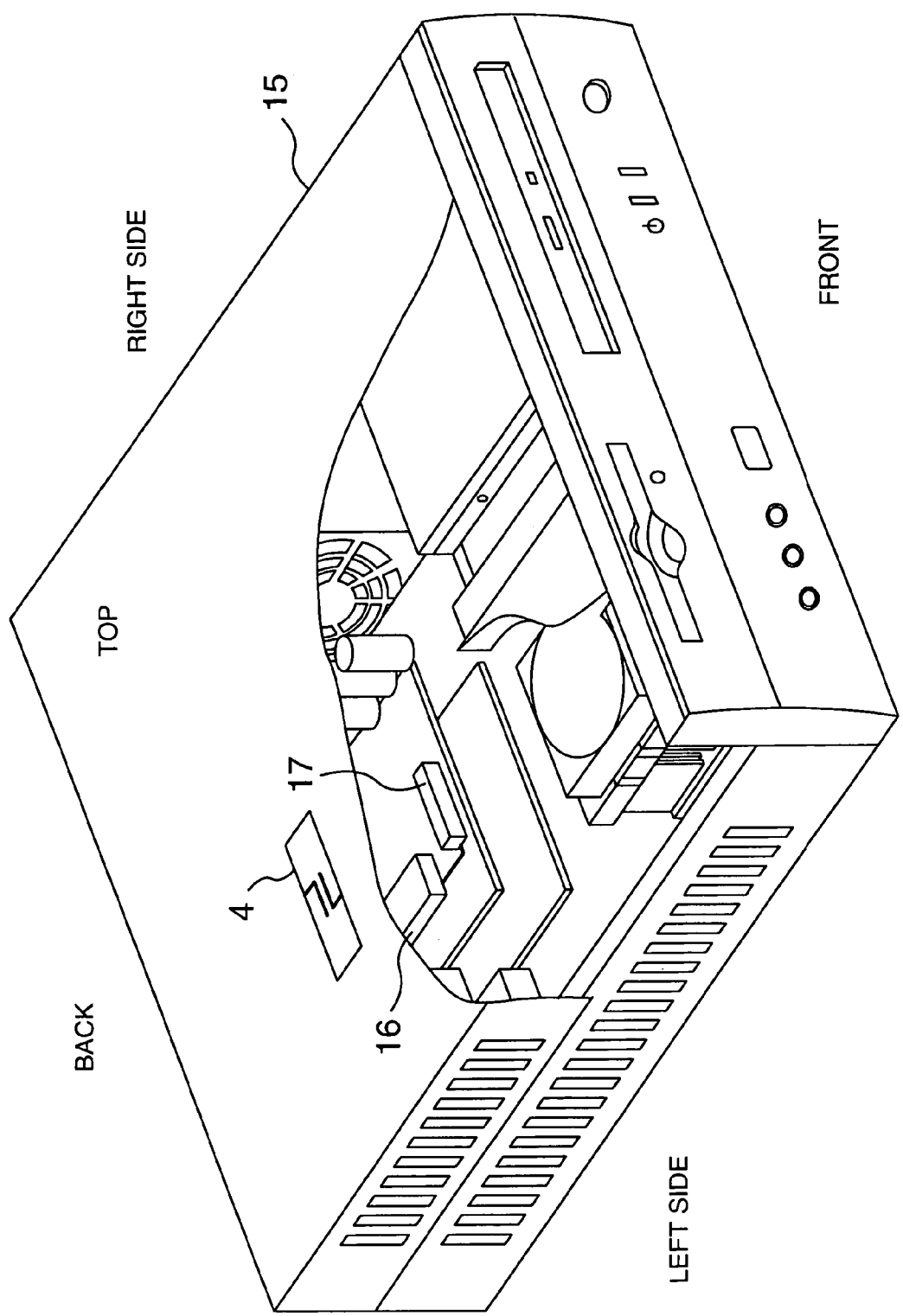

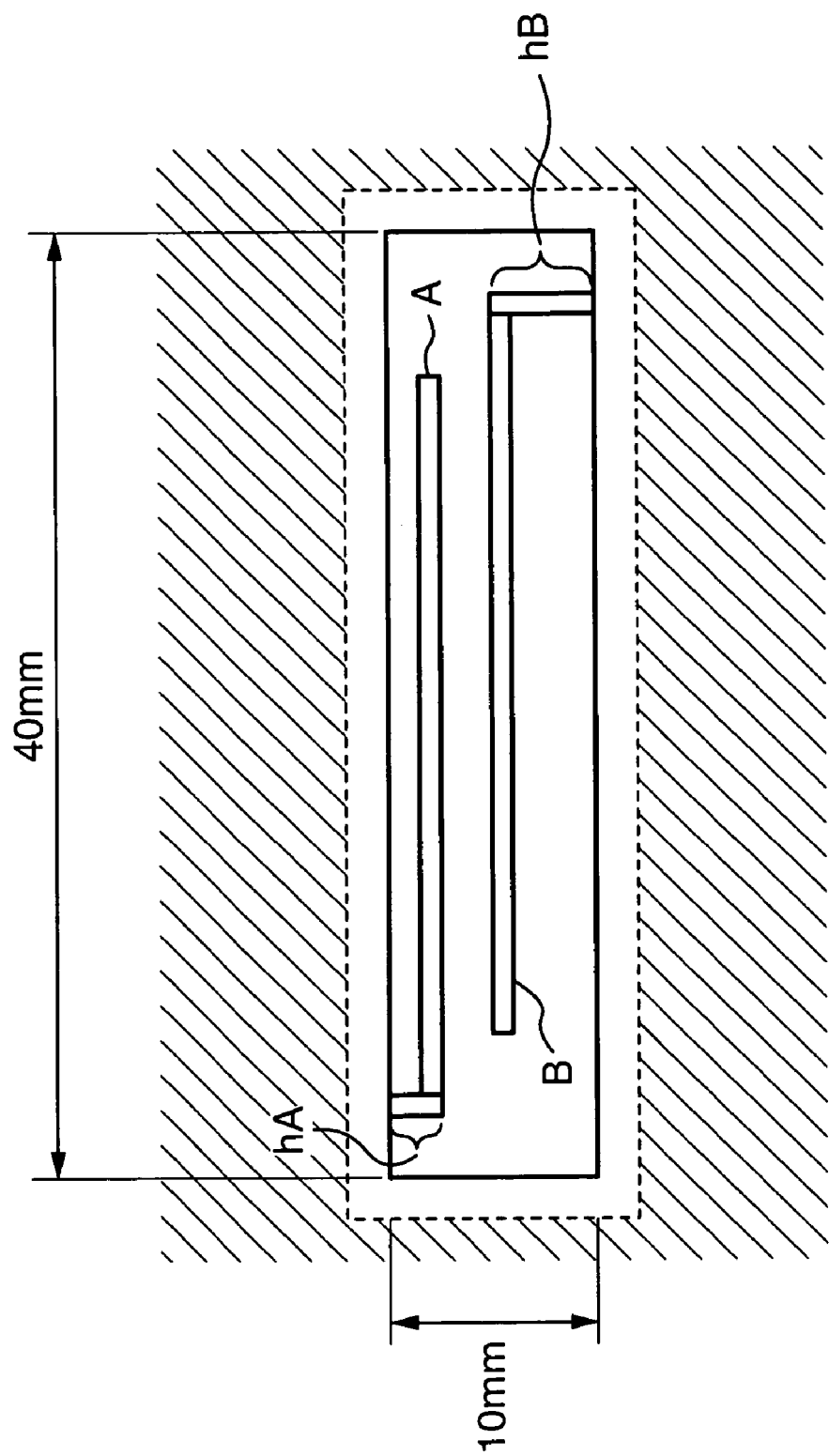

FREQUENCY-SELECTIVE SHIELD STRUCTURE AND ELECTRIC DEVICE HAVING THE STRUCTURE

BACKGROUND OF THE INVENTION

The present invention relates to a technique for selectively transmitting a radio wave having a predetermined frequency.

In recent years, the radio communication interface has spread in personal computers. A portable information device such as a notebook computer is carried freely and connected to a LAN environment into which the portable information device has been carried, by radio to conduct work. Such a use form has become widespread. However, the radio communication interface is easily affected by external electromagnetic noise. In addition, there is a problem of radio interference between radio communication interfaces and emission of a radio wave to the outside. Therefore, radio interference from external electromagnetic noise and emission of a radio wave are prevented by using a shield plate for shielding the radio wave.

If the shield plate is installed, however, the space is bisected via the shield plate to a region where a radio wave can be used and a region where a radio wave cannot be used. For preventing specific radio communication from being shielded, it is necessary to receive a radio wave once by using a receiver, pulls out the received signal across the shield plate by using a cable, and transmit the received signal as a radio wave again by using a transmitter.

As a technique for conducting radio communication between regions bisected via the shield plate without providing a transceiver and a cable, there is a technique disclosed in JP-A-2002-50893. However, this technique has a problem that the frequency selectivity of the antenna is low and the emission of the radio wave is significant in a frequency band higher than the radiant frequency of the antenna. Furthermore, it is necessary to form an antenna on only one side of the shield plate but also on the other side of the shield plate. Therefore, the structure for mounting the antenna portion on the shield plate becomes complicated, and the thickness of the shield plate increases, resulting in a complicated manufacturing process.

On the other hand, spread of the radio communication interface represented by IEEE 802.11b and Bluetooth® has advanced, and electronic devices, such as personal computers, incorporating these radio communication interfaces are increasing. In electronic devices such as computers, EMI (electromagnetic interference) emitted from the inside of the device is regulated, and it is typical to provide a device chassis with a shield structure so as to prevent EMI from being emitted from the inside of the device. In the case where a radio communication interface is incorporated in the chassis of the electronic device, therefore, conventionally a transmission and reception antenna is mounted outside the device, or a notch is provided in a shield structure of a portion incorporating the antenna so as to hold down the EMI to such a degree as to pass the regulation.

In a structure in which the antenna is mounted outside the device, the antenna portion projects. This results in a problem that the antenna is broken by falling of the device or a shock caused by touch. In the case where a notch is provided in the shield structure, there is a problem that the notch cannot be made large to minimize the EMI and the directivity of the antenna becomes narrow, or a problem that the antenna gain cannot be made sufficiently large.

SUMMARY OF THE INVENTION

A technique for preventing radio interference caused by invasion of an unnecessary radio wave from the outside of a specific space will be disclosed. A technique for shielding a radio wave that should not be emitted from a specific space to the outside will be disclosed. A shield technique that transmits a radio wave required for radio communication, that is simple in structure, and that is high in frequency selectivity will be disclosed.

An opening portion having a specific shape and a specific perimeter length is formed in a conductor. A filter portion having a specific shape and size is connected to the opening portion.

Other objects, features and advantages of the invention will become apparent from the following description of the embodiments of the invention taken in conjunction with the accompanying drawings.

BRIEF DESCRIPTION OF THE DRAWINGS

FIGS. 1A and 1B show an example of a frequency-selective shield structure;

FIG. 6 is a graph showing a comparison calculation result between the conventional technique and the frequency-selective shield structure shown in FIG. 1;

FIGS. 8A and 8B show a frequency-selective shield wallpaper plate;

FIG. 11 shows another application example of a frequency-selective shield;

FIGS. 14A and 14B show a shield structure in the case where it is used with a specific radio protocol.

DESCRIPTION OF THE EMBODIMENTS

Figure 2A:
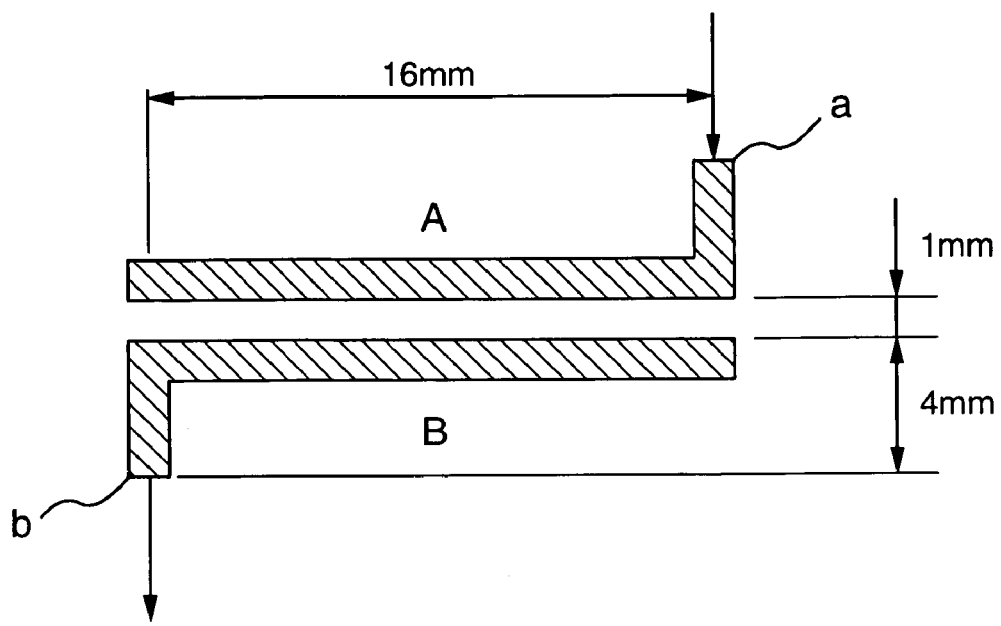
FIGS. 2A and 2B show an example of a high frequency filter.

FIGS. 1A and 1B show how a frequency-selective shield structure is formed in a conductor having a size that is large enough to intercept radio waves.

FIG. 1A is a sectional view of a conductor 1 having a frequency-selective shield structure formed therein. As shown in FIG. 1A, an opening portion 2 having a perimeter length that substantially coincides with a wavelength of a radio wave having a frequency to be transmitted is provided in the conductor 1. This opening portion passes through both surfaces of the conductor. The opening portion 2 functions as a slot antenna for a radio wave having a frequency that can be transmitted according to the perimeter length. Denoting a length of a short side of the opening portion 2 by "g" and a length of a long side of the opening portion 2 by "L," the length of the perimeter=2(g+L).

In addition, a high frequency filter 3 is formed on one surface of the conductor. The high frequency filter 3 may be formed on either of the surfaces, or may be formed within the conductor 1. However, it is desirable that the high frequency filter 3 is formed on the radio wave generation source side. This is because an interception current flows intensely in a direction in which the radio wave enters. FIG. 1B is a diagram obtained when the frequency-selective shield is viewed from the front of the conductor. Here, a band pass filter is used as an example of the high frequency filter. With reference to FIG. 1B, there are a region "a'" and a region "b'" through which a shield current hardly flows, between end portions of the opening portion 2 having long sides. The reason why the regions through which the shield current hardly flows will be described later. The high frequency filter portion 3 is connected between the region "a'" and the region "b'", i.e., between regions having a relatively large potential difference. By connecting the high frequency filter 3 to the opening portion 2 formed in the conductor, a structure 4 (hereafter referred to as frequency-selective shield structure) for selectively transmitting a radio wave having a specific frequency is formed.

Figure 2B:
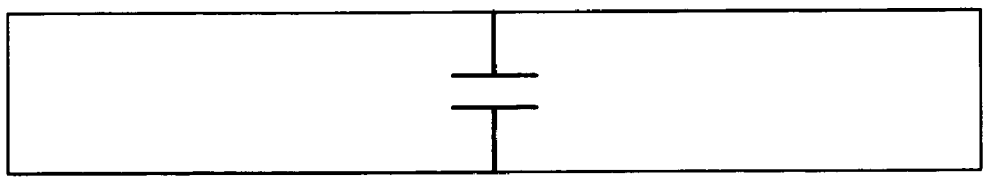

FIGS. 2A and 2B show an example of the high frequency filter. As shown in FIGS. 2A and 2B, the high pass filter is implemented by using a band pass filter. The high pass filter includes a conductor A having a signal input end "a" and a conductor B having a signal output end "b." Each of the conductor A and the conductor B has a length of, for example, 16 mm. Each of the signal input end "a" and the signal output end "b" has a length of, for example, 4 mm. In addition, a spacing between the conductor A and the conductor B is 1 mm, and the conductor A and the conductor B are disposed in parallel with each other.

If spatial inductive coupling occurs between the conductor A and the conductor B at a specific frequency, a signal is transmitted from the signal input end "a" of the conductor A to the signal output end "b" of the conductor B. Although the conductor A and the conductor B are disposed in parallel with each other, it is not always necessary that the conductor A and the conductor B are disposed in parallel with each other. If the conductor A and the conductor B are disposed substantially in parallel with each other, however, signal transmission from the conductor A to the conductor B is facilitated by increased inductive coupling at a specific frequency.

By the way, although the conductor A and the conductor B are disposed substantially in parallel with the long sides of the opening portion, it is not restrictive. For example, the conductor A and the conductor B may be disposed at an acute angle to the long sides of the opening portion as shown in FIG. 1B.

FIG. 2B shows another example of the high frequency filter. In the example shown in FIG. 2B, components, such as capacitors, that become small in impedance at high frequencies are used. The high frequency filter may be formed of such a discrete circuit. As a characteristic required for the filter, it is necessary that the impedance is high at frequencies lower than an upper limit of a frequency region to be transmitted. In addition, it is necessary to lower the impedance at frequencies higher than the upper limit of the frequency region to be transmitted. In a frequency constant circuit, a capacitor or the like is conceivable as shown in FIG. 2B. In a distributed constant circuit, a microstrip line filter or the like is conceivable as shown in FIG. 2A.

The principle of the frequency-selective shield structure shown in FIG. 1A will now be described.

In the case where a radio wave is reflected at the surface of the conductor, a radio wave having a field strength of E striking at a surface of a conductor having an electric conductivity of σ causes a current j (hereafter referred to as shield current) to flow through the conductor surface. Typically, the relation among the field strength E, the electric conductivity σ, and the shield current j is represented as E=σj. The radio wave incident on the conductor is reflected by the shield current j on the surface of the conductor. If all of the incident radio wave is reflected by the shield current j, which flows on the surface of the conductor, the radio wave is not transmitted through the conductor at all.

In the case where an opening portion having such a shape as to prevent the shield current from flowing is provided in the conductor, therefore, the flow of the shield current is blocked at an end portion (hereafter referred to as end portion of the opening portion) of the opening portion formed in the conductor. The blocked shield current flows so as to avoid the opening portion, and electric charges are stored on the end portion of the opening portion. A radio wave is generated by the stored electric charges, and a part of the generated radio wave is transmitted through the conductor. Since the radio wave generated by the stored electric charges is thus transmitted through the conductor, the shield characteristic of the conductor having the opening portion formed therein against the radio wave are deteriorated. In other words, the capability of shielding the radio wave in the conductor having the opening portion formed therein is lowered.

Since the opening portion is formed in the conductor, it becomes difficult for the shield current that flows through the surface of the conductor to especially flow so as to cross the long sides at the end portions of the opening portion. Therefore, electric charges are stored at the end portions having the long sides, and a potential difference occurs between end portions having the long sides. If the end portions having the long sides between which the potential difference occurs are short-circuited by using any method, therefore, the shield current flows so as to cross the sides at the end portions of the opening portion. Even if there is an opening portion, therefore, the radio wave is shielded.

In addition, if the point approaches the center between the end portions of the opening portion having the long sides, it becomes hard for the shield current to flow. If the point approaches the center, electric charges stored at end portions of the opening portion having the long sides increase. If the point approaches the center, the potential difference occurring the end portions of the opening portion having the long sides increases. In other words, if the opening portion is short-circuited at a position where the potential difference occurring between the end parts of the opening portion is relatively large, it becomes easier for the shield current to flow and the effect of shielding the radio wave is enhanced. Therefore, it is more desirable to provide the high frequency filter in the central part of the long sides. In the case of FIG. 1, the signal input end "a" owned by the conductor A is connected to the region "a'" in the opening portion 2, and the signal input end "b" owned by the conductor B is connected to the region "b'" in the opening portion 2.

Figure 3A:
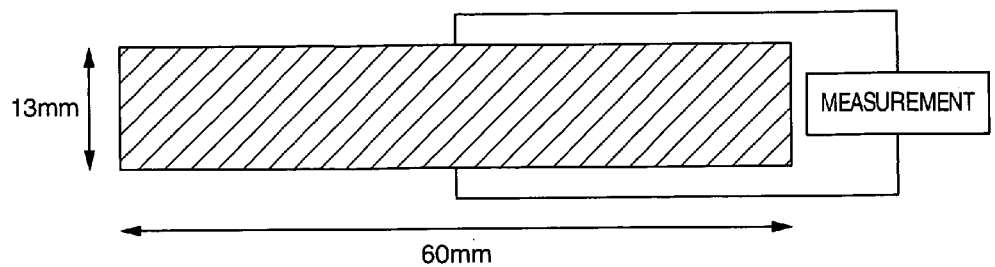
FIGS. 3A, 3B and 3C show various test models.
Figure 3B:
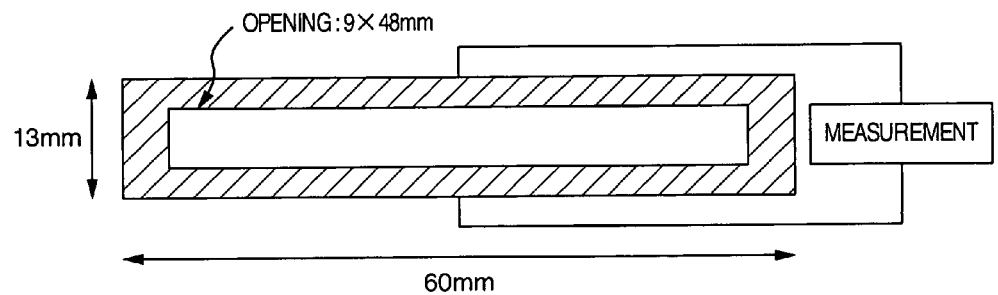
Figure 3C:
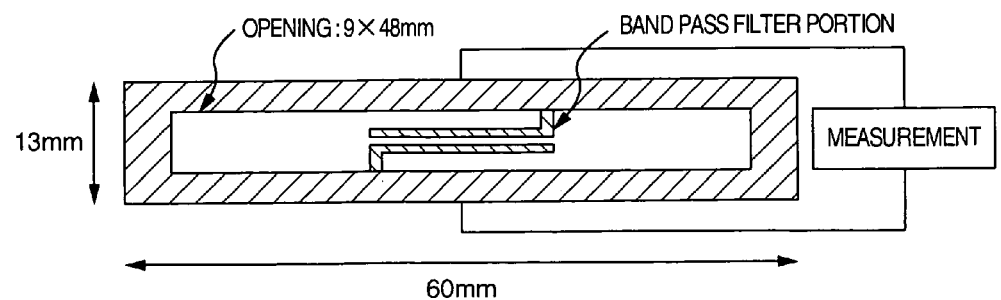

The shield characteristic of the conductor having the opening portion formed therein against the radio wave will now be described. As for the evaluation of the shield characteristic of the conductor against the radio wave, they can be evaluated by evaluating the easiness of flow of the current through the conductor. FIGS. 3A to 3C show a test model (conductor) used when the shield characteristic of the conductor against the radio wave are used for evaluation.

FIG. 3A shows a test model (conductor) having a longitudinal length of 13 mm and a lateral length of 60 mm and having no opening portions. FIG. 3B shows a test model in the case where the conductor has the same size as the model having no opening portions shown sin FIG. 3A and an opening portion is formed in the conductor. As for the size of the opening portion, the opening portion has a longitudinal length of 9 mm and a lateral length of 48 mm. FIG. 3C shows a test model in the case where a band pass filter portion shown in FIG. 2A is provided in the opening portion shown in FIG. 3B. In FIGS. 3A to 3C, the center of the opening portion coincides with the center of the conductor. By the way, the above-described numerical values can be implemented within the error range of ±20%.

Figure 4:
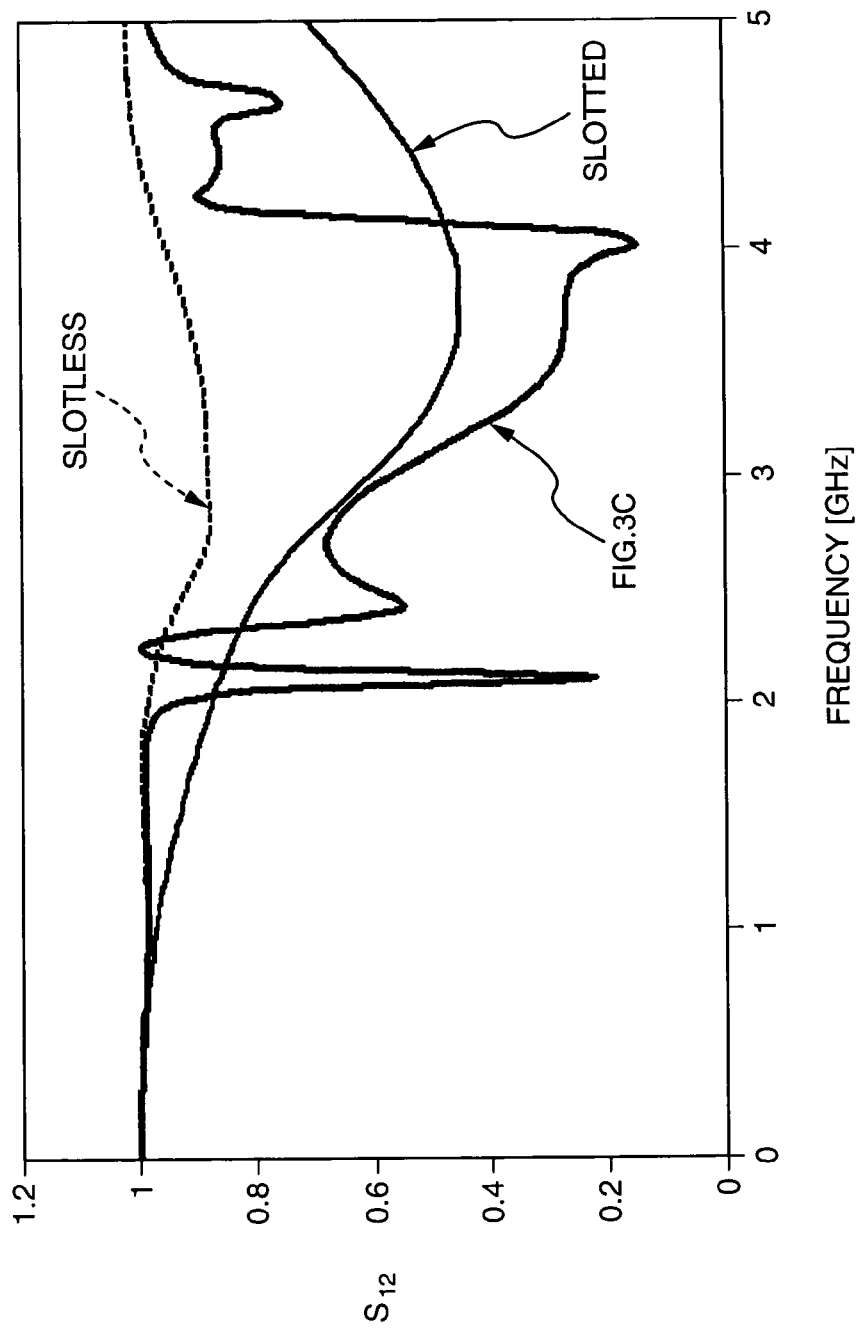
FIG. 4 is a graph showing calculation results of test models.

FIG. 4 shows a graph obtained by calculating the easiness of flow of the shield current in each of the test models shown in FIGS. 3A to 3C. By the way, calculation has been conducted supposing that the conductor 1 and the conductors A and B are perfect conductors in respective test models. As for the material of the conductor, copper is optimum. Copper has a conductivity of 58,000,000.0 S/m (where S is siemens and is a reciprocal of resistance). In a perfect conductor, the conductivity is infinitely great. The conductivity of copper is also sufficiently great. Even if calculation is conducted by using a slot antenna model having the same shape, therefore, there is little difference between copper and the perfect conductor in the range of 5 GHz or less. The abscissa of the graph indicates the frequency of the radio wave, and the ordinate indicates a scattering parameter S of the test model in the longitudinal direction.

The scattering parameter S is an index representing the magnitude of a signal passed between electrodes. In other words, if a signal having a magnitude of unity is input to one of the electrodes, a signal having a magnitude of S is output from the other of electrodes. Since normalization with the magnitude of the input signal has been conducted, the unit of the scattering parameter S is dimensionless. If S=1, it is meant that a signal having a magnitude of unity is input a signal having a magnitude of unity is output and the loss is zero. In other words, it is meant that when a conductor with S=1 is irradiated with a radio wave, the shield current flows without a loss and the radio wave is completely shielded. On the other hand, if S=0.1, a shield current that flows is as little as approximately 10% of a current that should flow. In other words, the radio wave that can be intercepted is approximately 10%, and 90% of the radio wave is transmitted. As S becomes smaller from unity, therefore, it becomes hard for the shield current to flow and the transmission of the radio wave is facilitated.

In the case of the test model having no opening portion (FIG. 3A), the calculation result shown in FIG. 4 indicates that the shield current flows favorably until the frequency of the radio wave becomes approximately 5 GHz. Therefore, it is appreciated that the test model having no opening portions (FIG. 3A) hardly transmits the radio wave. By the way, if the frequency of the radio wave becomes at least 2.5 GHz, S becomes somewhat small. This is a characteristic caused by the size of the test model.

In the case of the test model having an opening portion (FIG. 3B), it is shown that if the frequency of the radio wave becomes at least 2.5 GHz the shield current becomes hard to flow through the surface of the conductor and the shield characteristic of the test model is deteriorated. In the case where there is an opening portion, it is meant that a radio wave having a frequency of at least 2.5 GHz is transmitted. In other words, the opening portion having a size shown in FIG. 3B has a resonant frequency of approximately 2.5 GHz, and the opening portion functions as a slot antenna for a radio wave having a frequency of at least 2.5 GHz.

Figure 5:
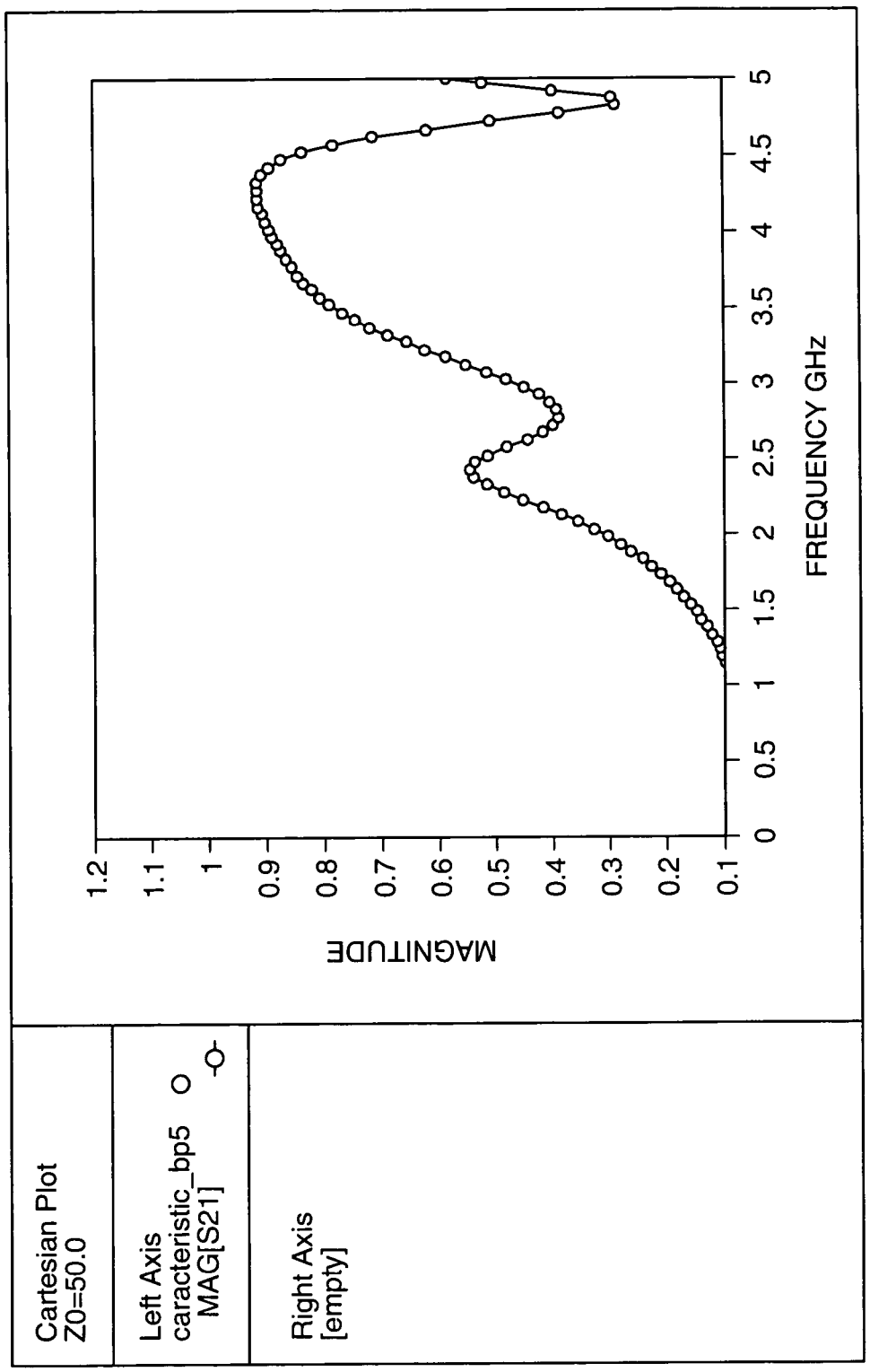
FIG. 5 is a graph showing a current that flows through a high frequency filter.

A characteristic of the high frequency filter is shown in FIG. 5. FIG. 5 is a graph showing easiness of flow of a current flowing from the conductor A to the conductor B in the high frequency filter shown in FIG. 2A. As shown in FIG. 5, the high frequency filter shown in FIG. 2A hardly lets a current flow at low frequencies. As the frequency becomes higher from approximately 2 GHz, however, the high frequency filter shown in FIG. 2A abruptly lets a current flow. If the frequency becomes at least 4 GHz, the current value abruptly decreases.

The characteristic of the high frequency filter in letting flow a current depends on the shape of the high frequency filter, and especially the length of the conductor A and the conductor B. If the conductor A and the conductor B are long, especially as the portions of the conductor A and the conductor B that are parallel with each other become long, the signal is passed from a lower frequency. Conversely, as the portions of the conductor A and the conductor B that are parallel with each other become short, only higher frequencies are passed through. If the conductor A and the conductor B become short, therefore, the frequency of the current that flows through the high frequency filter becomes higher and the width of the frequency included in the transmitted radio wave becomes wide.

By the way, FIG. 5 shows a calculation result of easiness of current flow in the case where a signal is input from the signal input end "a" of the high frequency filter shown in FIG. 2A. Also in the case where the signal is input from the signal output end "b," the calculation result becomes substantially the same, because the signal input end "a" and the signal output end "b" form a substantially symmetrical structure.

In the case of the test model that includes the high frequency filter having the characteristic shown in FIG. 5, the scattering parameter S≈1 when the frequency is approximately 2 GHz or less, and a radio wave having a frequency of approximately 2 GHz or less is shielded. Furthermore, it becomes hard for the shield current to flow when the frequency is in the range of approximately 2 GHz to approximately 4 GHz. This means that a radio wave having a frequency in the range of approximately 2 GHz to approximately 4 GHz is transmitted. When the frequency is at least approximately 4 GHz, the shield current is let flow again. This means that a radio wave having a frequency of at least approximately 4 GHz is shielded. Therefore, the test model shown in FIG. 3C shields a radio wave in the frequency region in which a current flows through the high frequency filter.

In this way, by adjusting the shape and size of the opening portion provided in the conductor and adjusting the shape and size of the high frequency filter connected between end portions of the opening portion having long sides, only a radio wave having a frequency to be transmitted can be selectively transmitted.

By the way, the plane shape of the opening portion is similar to a rectangle. This is because the effect of preventing the shield current that flows through the surface of the conductor is more significant in the case where the plane shape of the opening portion is a rectangle or a shape similar to the rectangle. As a matter of course, other shapes such as a circular shape can also prevent the shield current and consequently they can be adopted as the shape of the opening portion.

FIG. 6 is a graph that compares the frequency shield structure shown in FIG. 3C with the prior art (JP-A-2002-

50893) in easiness of flow of the shield current. In FIG. 6, a solid line indicates the easiness of flow of the shield current of FIG. 3C shown in FIG. 4 in a wider frequency range. A dotted line indicates the easiness of the shield current in the prior art.

The electromagnetic wave shield structure in the prior art appears to indicate the shield characteristic at a frequency of approximately 3 GHz. However, this characteristic is caused by a singular point occurring in a numerical calculation at a frequency of approximately 3 GHz. Therefore, it is considered that the radio wave shield characteristic decreases at a frequency of approximately 3 GHz. Considering this point, the prior art can transmit a radio wave having a frequency higher than 2 GHz, but its shield characteristic against a radio wave having a frequency higher than approximately 4 GHz is low. On the other hand, the structure shown in FIG. 3C has such a characteristic as to transmit a radio wave having a frequency in the range of approximately 2 GHz to approximately 4 GHz. Therefore, it is evident that the structure shown in FIG. 3C has high selectivity for a frequency included in the radio wave to be transmitted, as compared with the prior art.

Application examples of various frequency-selective radio wave shields according to the above-described principle of the present invention will now be described. FIGS. 7A to 12B show examples of a radio wave shield having the above-described frequency-selective shield structure.

Figure 7A:
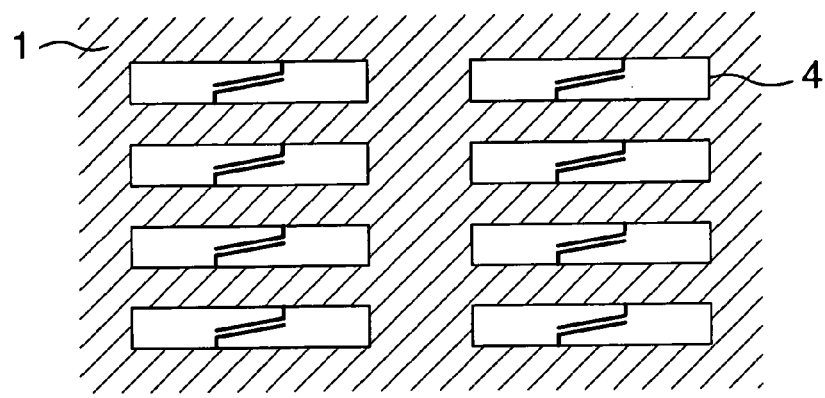
FIGS. 7A to 7C show an example of an array of frequency-selective shield structures.
Figure 7B:
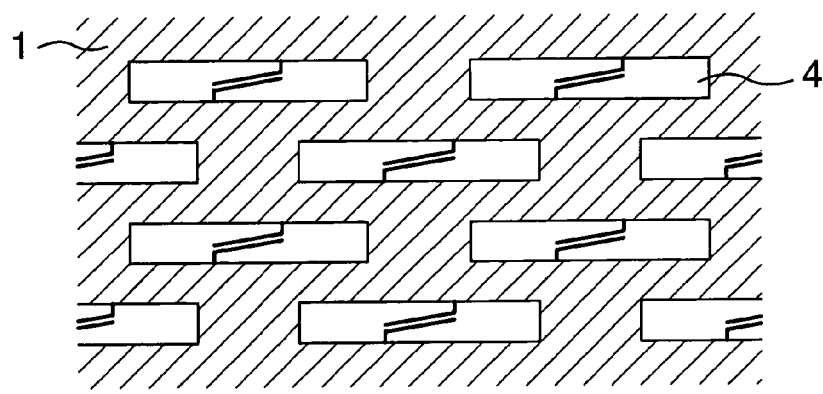

FIG. 7A shows a plurality of frequency-selective shield structures formed in a conductor having a size that is large enough to intercept a radio wave. FIG. 7B shows a plurality of shield structures 74 formed in a zigzag arrangement in a conductor having a size that is large enough to intercept a radio wave.

Even if one frequency-selective shield structure 4 is formed in the conductor 1 as shown in FIG. 1B, there is a possibility that the transmissivity of the radio wave will become low. This is caused by the radio wave that strikes against a different region of the conductor in which the frequency-selective shield structure 4 is not formed. In order to avoid such a phenomenon, a plurality of frequency-selective shield structures 4 are provided in the conductor 1. By providing a plurality of frequency-selective shield structures 4, it becomes possible to widen the range in which the radio wave is transmitted and facilitate transmission of a radio wave having a specific frequency.

If an arrangement in which the frequency-selective shield structures 4 are substantially aligned as shown in FIG. 7A is formed in the conductor, potential differences of respective frequency-selective shield structures 4 are stacked. In the case of such an arrangement, the shield characteristic of the whole conductor against the radio wave is somewhat deteriorated. For mitigating the interaction among potential differences of the frequency-selective shield structures 4, therefore, it is suitable to arrange the frequency-selective shield structures 4 in a zigzag form as shown in FIG. 7B.

FIG. 8A shows a frequency-selective shield wainscot (or wallpaper) having a plurality of frequency-selective shield structures 4 formed therein.

As shown in FIG. 8A, a plurality of frequency-selective shield structures 4 are formed in a conductor plate 1 having a fixed size, and a frequency-selective shield wallpaper plate 5 is formed. Furthermore, these frequency-selective shield structures 4 are disposed in the conductor plate 1 so as to reduce the mutual influence among the above-described opening portions and the influence of the plane of polarization.

By the way, an insulating end sheet 6 may be attached to the conductor plate 1 so as to prevent rust or corrosion from being generated in the conductor plate 1. In the case where a plurality of shield wallpaper plates 5 are actually stuck on a necessary place (such as a wall of a single room or a wall of a building), however, conductor portions of the frequency-selective shield wallpaper plates 5 must be in contact with each other in order to prevent an unnecessary radio wave from being mixed. Therefore, it is desirable to attach the insulating end sheets 6 so as not to cover the whole of the conductor plate 1.

Figure 7C:
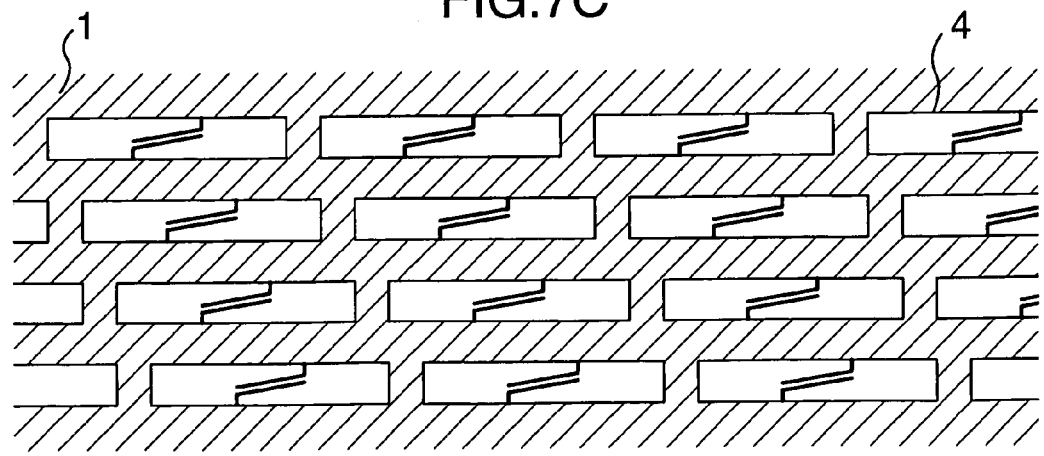

In FIG. 8A, the shield structures 4 are arranged according to a method different from that used in FIGS. 7A–7C. FIG. 8B shows its enlarged view. In FIG. 8B, a plurality of frequency-selective shield structures are formed on a conductor having a size that is large enough to intercept the radio wave, so as to have an arrangement with due regard to the influence of the plane of polarization.

In the frequency-selective shield structure 4 shown in FIG. 1B, the width "g" of the opening portion 2 is made sufficiently short as compared with the width "L" and the high frequency filter portion 3 is connected so as to mitigate the potential difference between the region "a'" and the region "b'" for the opening portion 2. Since the width "g" of the opening portion 2 is short, therefore, it is difficult to prevent the shield current from flowing in the lateral direction.

In other words, a radio wave having a frequency to be transmitted generates a shield current that flows in the lateral direction, by the influence of the plane of polarization. It is facilitated for the shield current in the lateral direction to flow by the influence of the width "g" of the opening portion 2. Therefore, electric charge stored between the short sides of the opening portion 2 is little, and the radio wave that generates the shield current flowing in the lateral direction becomes hard to be transmitted. In order to avoid this phenomenon, the frequency-selective shield structures 4 are partially disposed in the longitudinal direction as shown in FIG. 8B. As a result, it is possible to mitigate the influence of the plane of polarization and improve the transmissivity for the radio wave. Furthermore, the effect of the frequency-selective shield structures 4 is further enhanced. By the way, the arrangement shown in FIG. 8B can be applied not only to the case where the wallpaper plate is used but also to other examples.

Figure 9:
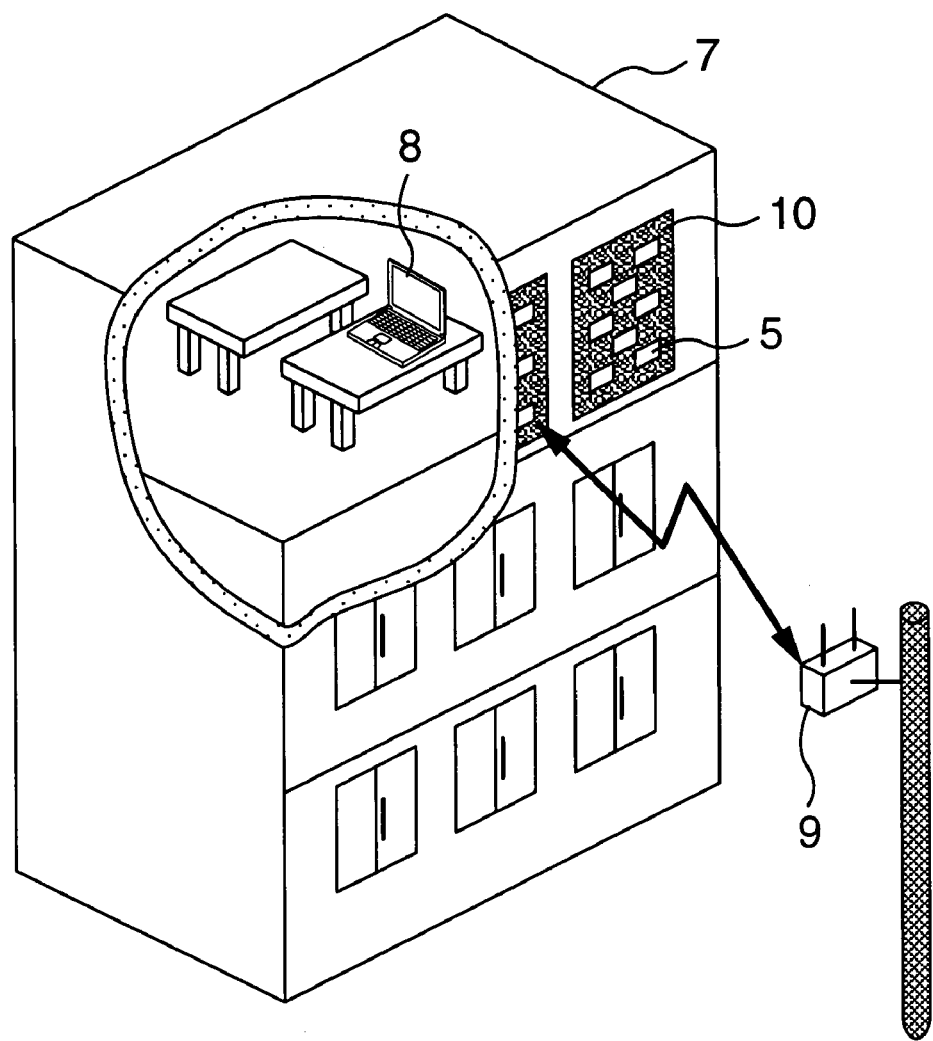
FIG. 9 shows an application example of a frequency-selective shield.

FIG. 9 shows how the frequency-selective shield wallpaper plate 5 shown in FIGS. 8A and 8B is used for a building.

As shown in FIG. 9, an electronic device 8 is placed in one room in a building 7. The electronic device 8 is to communicate with a base station 9 via a radio interface. On at least a wall plane included in wall planes 10 of a room in which the electronic device 8 is placed and opposed to the base station 9, the frequency-selective shield wallpaper plates 5 are formed. Owing to the frequency-selective shield wallpaper plates 5, electromagnetic radiation or unintended radio wave emission from radio communication or the electronic device 8 used within the building 7 can be prevented. Furthermore, it becomes possible to selectively transmit a radio wave having a frequency used in radio communication between the electronic device 8 and the base station 9. As examples of the base station 9, there are a base station of portable telephone and an access point of a radio LAN. In addition, radio communication between the inside and the outside of a room can be conducted by means of a radio wave having a necessary frequency by sticking a plurality of frequency-selective shield wallpaper plates on a wall or a ceiling of a room. It becomes unnecessary to provide a transceiver on each of the inside and outside of a room in order to avoid the conventional problem of radio interference.

Figure 10:
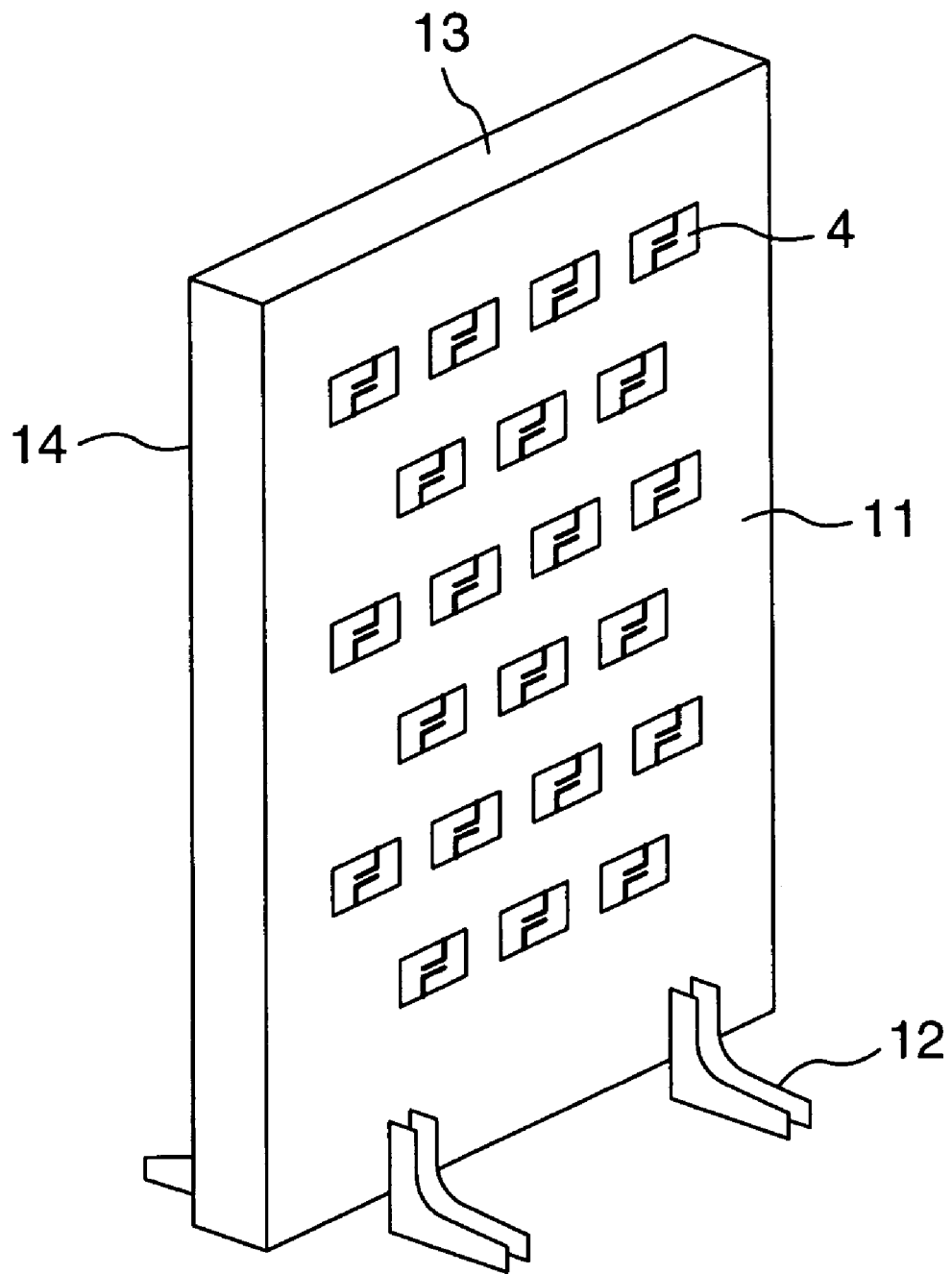
FIG. 10 shows another application example of a frequency-selective shield.

FIG. 10 shows a partition in a room on which a plurality of frequency-selective shield structures are stuck. A partition 13 includes a conductor plane 11, a plurality of frequency-selective shield structures 4 formed on the conductor plane 11, and feet 12 attached so as to make the partition 13 self-supporting. By the way, as for an arrangement of the frequency-selective shield structures 4 shown in FIG. 10, the frequency-selective shield structures 4 may also be arranged as shown in FIG. 7B or FIG. 8B in order to suppress the mutual influence among potential differences on the opening portions and the influence of the plane of polarization.

If the thickness of the conductor plane 11 is thicker than the depth by which the lowest frequency of the radio wave to be intercepted intrudes into the conductor, it is sufficient. For example, if the structure material of the conductor plane 11 is copper and it is desired to shield a radio wave having a frequency of at least 100 MHz, it is sufficient to make the thickness of the conductor plane 11 equal to or greater than approximately 6 μm. Because the depth by which a radio wave having a frequency of 100 MHz is 6 μm. If the mechanical strength is insufficient with only the conductor plane 11, it is possible to attach a blacking plate 14 to reinforce the partition 13. Since in the present embodiment the backing plate must not intercept the radio wave, it is necessary to form the backing plate 14 of an insulating end member.

Owing to the above-described configuration, a specific space capable of conducting radio communication with only a required frequency can be formed even in the same room by using the partition having frequency-selective shield structures. In the specific space, radio interference due to an unnecessary radio wave from the outside of the space and emission of EMI to the outside of the space can be avoided.

FIG. 11 shows an example of an electronic device including a chassis having frequency-selective shield structures 4 formed thereon. An electronic device 15 includes therein a radio communication interface circuit 16 and an antenna 17 for radio wave transmission and reception, and exchanges data between the inside and outside of the chassis by using a radio wave.

The chassis of the electronic device 15 is formed of a conductor such as a steel plate in order to prevent emission of EMI from the inside to the outside. In the case where the antenna 17 is disposed within the chassis of the electronic device 15, therefore, a radio wave from the outside of the chassis is also shielded, and consequently data exchange with the outside of the chassis cannot be conducted.

In the electronic device 15 shown in FIG. 11, at least one frequency-selective shield structure 4 is provided on the chassis of the electronic device 15 so as to be positioned in the vicinity of the radio communication antenna 17 disposed inside. Thus, owing to the frequency-selective shield structure 4 on the top plane of the chassis provided in the vicinity of the antenna 17, directivity of the radio wave in the upward direction is intensified. On the other hand, it is also possible to provide the frequency-selective shield structure 4 on a side plane, a front plane or a back plane of the electronic device 15 according to the position in which the antenna 17 is mounted. In this case, the radio wave directivity can be made uniform.

Figure 12A:
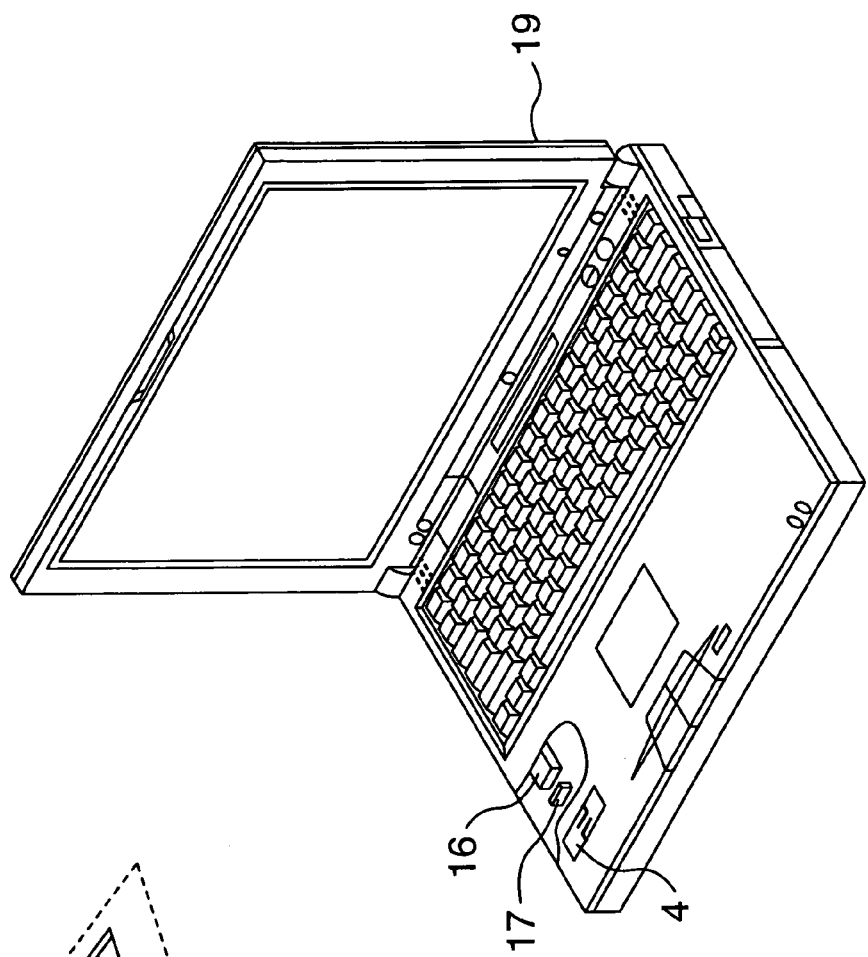
FIGS. 12A and 12B show an example of application of a frequency-selective shield to a notebook computer.
Figure 12B:
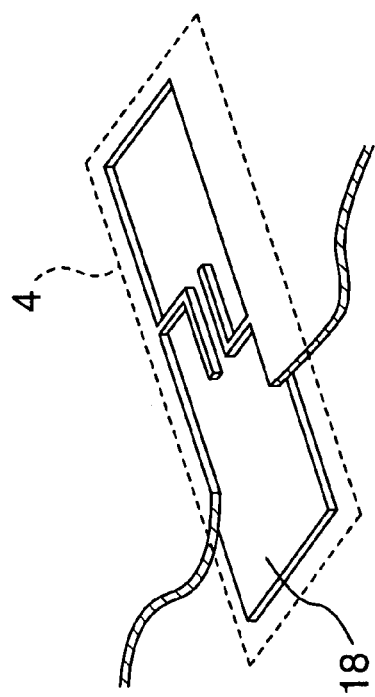

FIGS. 12A and 12B show a frequency-selective shield structure provided on a chassis of a notebook computer. FIG. 12A is an exterior view of a notebook computer, and FIG. 12B is an enlarged view of a shield structure 4 provided on a notebook computer.

A radio communication interface including a radio communication interface circuit 16 and an antenna 17 is mounted on a notebook computer 19. In order to prevent EMI emission from the inside, the chassis is typically formed of a mold structure material plated with metal.

In a notebook computer shown in FIG. 12A, a frequency-selective shield structure 4 is provided on a chassis near the antenna 17. In the case where the structure material of the chassis is a mold structure material, the mold is masked when plating, and an opening portion and a high frequency filter portion, which form the frequency-selective shield structure 4, can be formed by plating.

FIG. 12B shows how the frequency-selective shield structure 4 is reinforced. In the case where a frequency-selective shield structure 4 is formed on the chassis of the electronic device 15 such as a notebook computer, there is a possibility that the high frequency filter portion is deformed or destroyed by some external force because it is fine. For preventing such a phenomenon, it is desirable to reinforce the reverse or the obverse of the frequency-selective shield structure 4 by using an insulating end member 18.

The electronic device 15 shown in FIGS. 12A and 12B can conduct transmission and reception with the outside of the chassis via the frequency-selective shield structure 4 by using the radio communication antenna 17 disposed inside and a radio wave having a necessary frequency. At the same time, an electronic device having a chassis structure that does not emit EMI to the outside of the chassis of the electronic device 15 can be formed.

Figure 13:
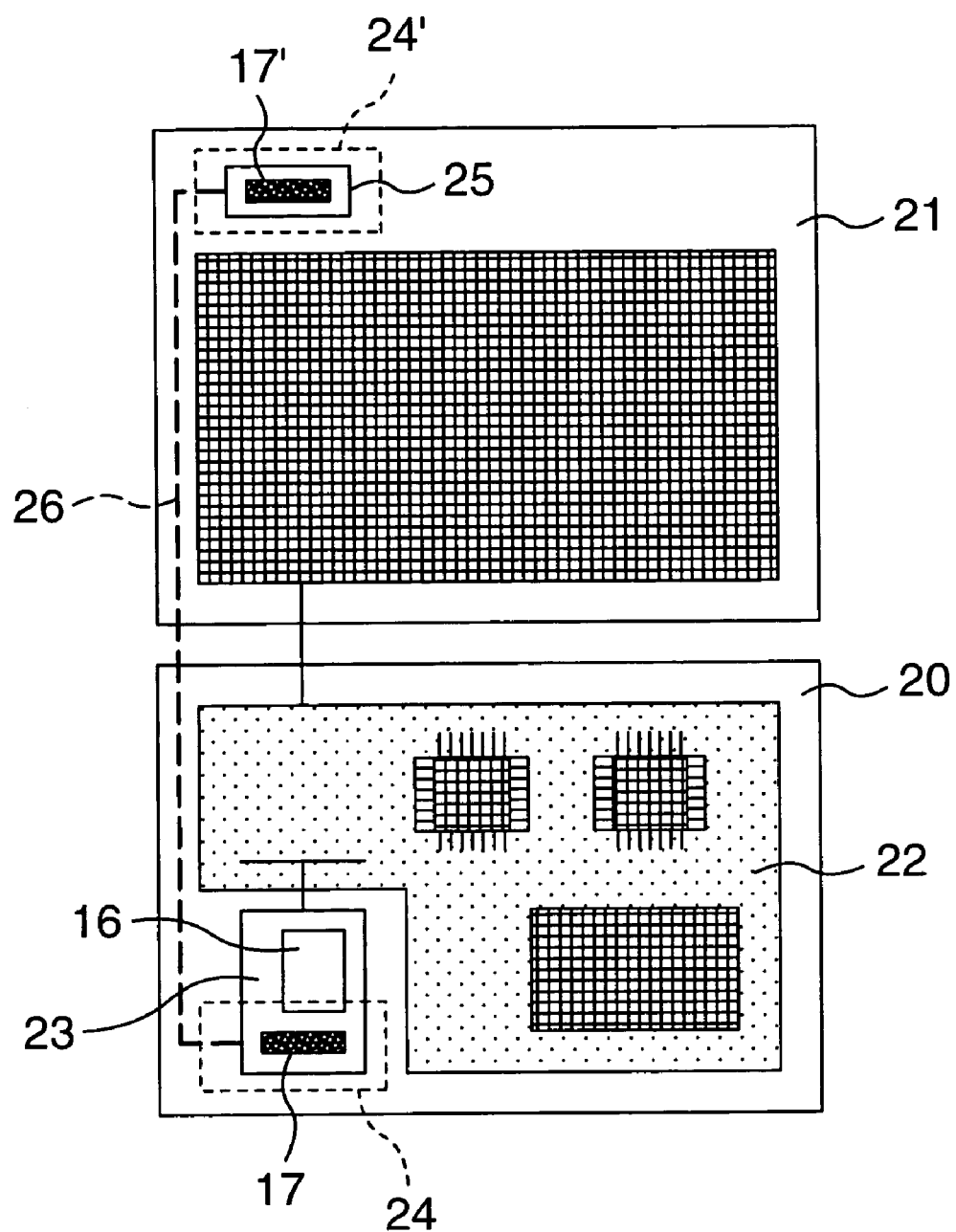
FIG. 13 shows a board structure in FIGS. 12A and 12B.

FIG. 13 shows an example of the internal structure of the notebook computer 19 and a forming position of the frequency-selective shield structure 4 shown in FIGS. 12A and 12B.

As shown in FIG. 13, the notebook computer 19 includes a first chassis having a processing portion 20 and a second chassis having a display portion 21. Within the first chassis having the processing portion, a main board 22 is mounted. Although not denoted by reference numerals for brevity, electronic elements such as a processor or a memory are mounted on the main board 22. A radio communication interface board 23 is also mounted within the first chassis having the processing portion independently of the main board 22. A radio interface circuit 16 and an antenna 17 are mounted on the radio communication interface board 23.

A frequency-selective shield structure 4 is formed in a position 24 of the first chassis corresponding to the antenna 17. As a result, the notebook computer 19 can conduct data exchange between the inside of the chassis and the outside of the chassis.

By the way, the radio interface circuit 16 and the antenna 17 may be mounted on the main board 22 instead of being mounted on the radio communication interface board 23, which is independent of the main board 22.

In addition, in the second chassis having the display portion, the antenna 17 may be mounted on a board 25 that is independent of the radio interface circuit 16, as shown in FIG. 13. Therefore, a frequency-selective shield structure 4 is formed in a position 24' of the second chassis corresponding to the antenna 17. In this case, a cable 26 for connecting the radio interface circuit 16 to the antenna 17 needs to be wired.

Thus, in the present embodiment, by forming a frequency-selective shield structure on a chassis of a notebook computer incorporating a radio communication interface, data communication between the radio communication interface within the chassis and the outside of the chassis can be conducted by using a radio wave having a necessary frequency. At the same time, radio interference with an unnecessary radio wave and emission of a radio wave to the outside of the chassis can be suppressed. Furthermore, unlike the prior art, it becomes unnecessary to receive a radio wave by using a receiver, pull out a received signal to the inside of the chassis by using a cable, and transmit the signal as a radio wave again. As a result, the manufacturing cost can be remarkably reduced.

Figure 14B:
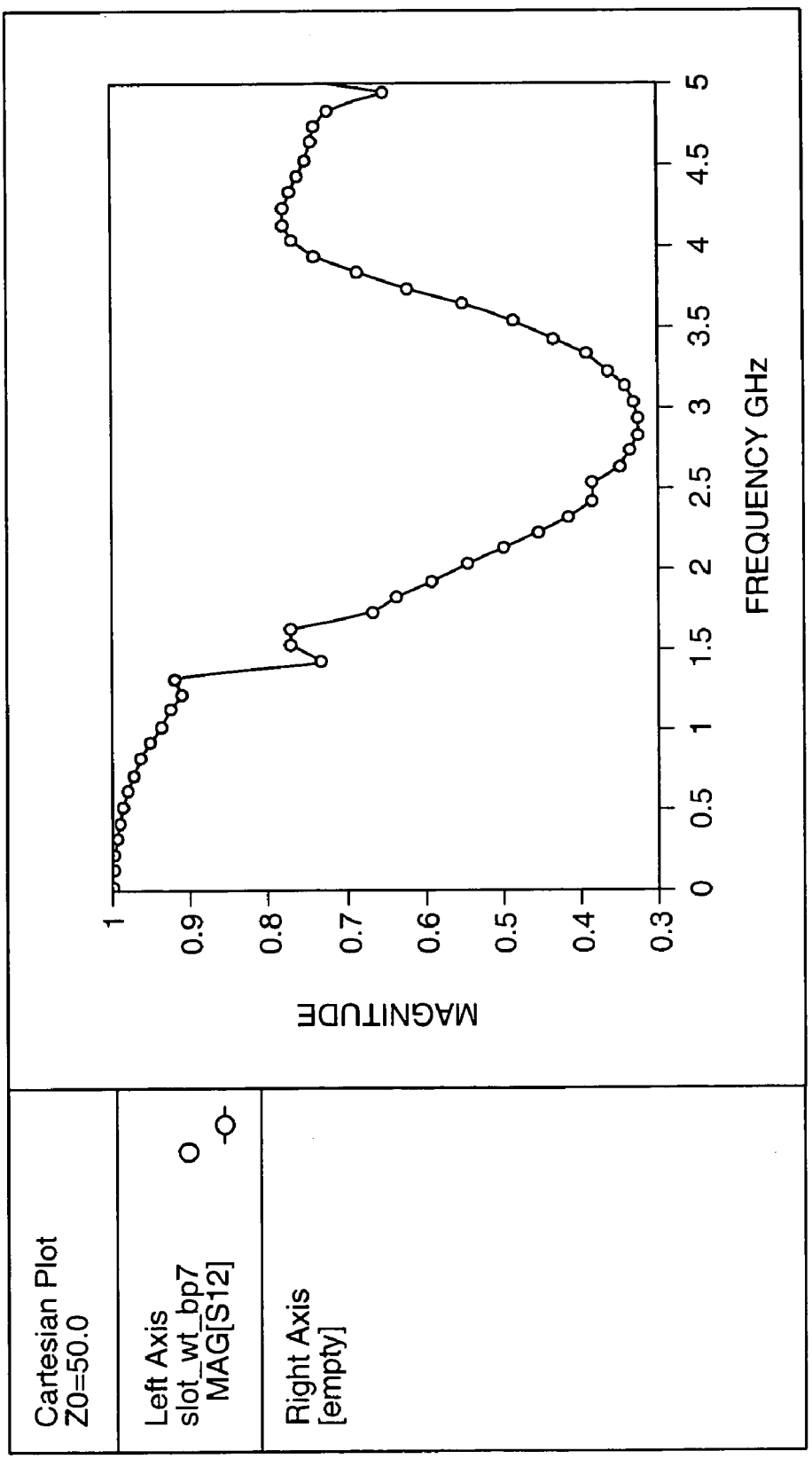

FIGS. 14A and 14B show an example in which the present invention is applied to a specific radio communication protocol. FIG. 14A shows a shield structure corresponding to IEEE802.11b. FIG. 14B shows a simulation result for the shield structure shown in FIG. 14A.

In IEEE802.11b, a range of 2.4 GHz to 2.5 GHz is used as the frequency region. This range, an ISM band (Industry Science Medical band), can be used without a license in Japan. The range around 5 GHz can be an IME band in other country. In order to intercept frequencies of 2.4 GHz or less, therefore, an optimum perimeter of the opening portion is 100 mm. In FIG. 14A, the long side has a length of 40 mm, and the short side has a length of 10 mm. In addition, in order to intercept radio waves having a frequency of at least 2.5 GHz, a band pass filter in which a current flows at a frequency of 2.5 GHz is used. Here, copper is used as the conductors A and B. Each of the conductors A and B has a length of 16 mm in the same way as FIG. 2A, and the spacing between the conductors A and B is 1 mm. Unlike FIG. 2A, however, in the example shown in FIG. 14A, the height hA of the input end on the conductor A side is lower than the height hB of the output end on the conductor B side. In other words, the band pass filter is disposed in a position nearer the input end side than the central part of the opening portion. Owing to such a configuration deviated from the center, it becomes easier for the band pass filter to let flow a current at high frequencies. In the case where the frequency region of a radio wave to be transmitted is narrow as in this example, a specific band can be selected by altering the position of the band pass filter and performing the tuning. By the way, the above-described numerical values can be implemented within +5%.

FIG. 14B shows a result of measurement simulation conducted by using the shield structure shown in FIG. 14A. In the shield structure shown in FIG. 14A, S becomes the minimum in the frequency region of 2.4 to 2.5 GHz as shown in FIG. 14B. In this way, it becomes possible to select a predetermined region and intercept radio waves in other frequency regions.

According to the present invention, it is possible to construct a radio communication space that is capable of transmitting a radio wave having a specific frequency and intercepting radio waves having other frequencies, and that does not cause radio interference with the outside and that does not emit EMI to the outside.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A frequency-selective shield structure comprising:
   a conductor, at least one opening portion having a first end and a second end opposed to each other being formed in said conductor;
   one filter portion, said filter portion comprising;
   a first transmission line having a signal input end; and
   a second transmission line having a signal output end,
   wherein said signal input end in said first transmission line is connected to said first end, said signal output end in said second transmission line is connected to said second end; and
   said first transmission line and said second transmission line are disposed in the opening portion and are arranged in parallel to each other with a spacing interposed therebetween to constitute a coupled filter.

2. The radio wave shield structure according to claim 1 wherein said high frequency filter is a band pass filter.

3. The radio wave shield structure according to claim 1, wherein said high frequency filter comprises:
   an input end, said input end being connected to said opening portion;
   a first transmission line connected to said input end;
   an output end, said output end being connected to said opening portion.

4. The radio wave shield structure according to claim 3, wherein said first transmission line and said second transmission line are opposed to each other.

5. The radio wave shield structure according to claim 4, wherein said first transmission line and said second transmission line are opposed to each other so as to be substantially parallel to each other.

6. The radio wave shield structure according to claim 3, wherein
   said input end is connected to a first side of said opening portion, and
   said output end is connected to a second side of said opening portion, said second side being opposed to said first side.

7. The radio wave shield structure according to claim 6, wherein
   said input end is connected to a middle point of said first side, and
   said output end is connected to a middle point of said second side.

8. The radio wave shield structure according to claim 6, wherein said conductor, said first transmission line and said second transmission line are formed of copper.

9. The radio wave shield structure according to claim 6, wherein
   said opening portion has a section taking the shape of a rectangle, said rectangle has a perimeter of substantially 114 mm, and
   each of said first and second transmission lines has a length of 16 mm, and said first and second transmission lines has a spacing of 1 mm.

10. The radio wave shield structure according to claim 9, wherein said first and second transmission lines are disposed nearer said first side with respect to a middle point between said first side and said second side.

11. The radio wave shield structure according to claim 1, wherein said high frequency filter is disposed in a center part of said opening portion.

12. The radio wave shield structure according to claim 1, wherein said high frequency filter is a capacitor.

13. The radio wave shield structure according to claim 1, wherein said opening portion has a section taking the shape of a rectangle.

14. The radio wave shield structure according to claim 13, wherein
   a plurality of opening portions are formed in said conductor,
   said opening portions are arranged in a direction along long sides of said rectangle, and
   said opening portions are arranged in a direction along short sides of said rectangle with central parts of said long sides being shifted.

15. The radio wave shield structure according to claim 13, wherein
   a plurality of opening portions are formed in said conductor, and
   said opening portions are arranged in a zigzag grid pattern.

16. An electronic device having radio shield structure, said electronic device comprising:
   a radio communication interface device;
   a chassis incorporating said radio communication interface device; and
   a radio shield structure, said radio shield structure comprising:
   a conductor, an opening portion having a first end and a second end opposed to each other being formed in said conductor;
   a high frequency filter comprising:
   a first transmission line having a signal input end; and
   a second transmission line having a signal output end,
wherein said signal input end in said first transmission line is connected to said first end, said signal output end in said second transmission line is connected to said second end; and
wherein said high frequency filter is a coupled filter including said first and second transmission lines arranged in parallel to each other with a spacing interposed therebetween and disposed in said opening portion.

17. The electronic device having radio wave shield structure according to claim 16, wherein
   said chassis forms one body with said conductor, and
   said opening portion is formed on said chassis.

18. The electronic device having radio wave shield structure according to claim 16, wherein said radio wave shield structure is formed near said radio communication interface.

19. The electronic device having radio wave shield structure according to claim 16, wherein
   said chassis is a mold structure subjected to plating, and
   said conductor is a plating layer of said chassis.

20. The electronic device having radio wave shield structure according to claim 19, wherein said radio wave shield structure is reinforced by an insulating end member.

21. The electronic device having radio wave shield structure according to claim 16, wherein said high frequency filter is a band pass filter.

22. The electronic device having radio wave shield structure according to claim 16, wherein said high frequency filter comprises:
   an input end, said input end being connected to said opening portion;
   a first transmission line connected to said input end;
   an output end, said output end being connected to said opening portion.

23. The electronic device having radio wave shield structure according to claim 22, wherein said first transmission line and said second transmission line are opposed to each other.

24. The electronic device having radio wave shield structure according to claim 23, wherein said first transmission line and said second transmission line are opposed to each other so as to be substantially parallel to each other.

25. The electronic device having radio wave shield structure according to claim 22, wherein
   said input end is connected to a first side of said opening portion, and
   said output end is connected to a second side of said opening portion, said second side being opposed to said first side.

26. The electronic device having radio wave shield structure according to claim 25, wherein
   said input end is connected to a middle point of said first side, and
   said output end is connected to a middle point of said second side.

27. The electronic device having radio wave shield structure according to claim 25, wherein said conductor, said first transmission line and said second transmission line are formed of copper.

28. The electronic device having radio wave shield structure according to claim 25, wherein said radio communication interface device uses a radio wave in an IME band.

29. The electronic device having radio wave shield structure according to claim 28, wherein
   said conductor, said first transmission line and said second transmission line are formed of copper,
   said opening portion has a section taking the shape of a rectangle, said rectangle has a perimeter of substantially 114 mm, and
   each of said first and second transmission lines has a length of 16 mm, and said first and second transmission lines has a spacing of 1 mm.

30. The electronic device having radio wave shield structure according to claim 26, wherein said first and second transmission lines are disposed nearer said first side with respect to a middle point between said first side and said second side.

31. The electronic device having radio wave shield structure according to claim 16, wherein said high frequency filter is disposed in a center part of said opening portion.

32. The electronic device having radio wave shield structure according to claim 16, wherein said high frequency filter is a capacitor.

33. The electronic device having radio wave shield structure according to claim 16, wherein said opening portion has a section taking the shape of a rectangle.

34. The electronic device having radio wave shield structure according to claim 33, wherein
   a plurality of opening portions are formed in said conductor,
   said opening portions are arranged in a direction along long sides of said rectangle, and
   said opening portions are arranged in a direction along short sides with central parts of said long sides being shifted.

35. The electronic device having radio wave shield structure according to claim 33, wherein
   a plurality of opening portions are formed in said conductor, and
   said opening portions are arranged in a zigzag grid pattern.

* * * * *